(12) United States Patent
Mao et al.

(10) Patent No.: US 6,406,992 B1
(45) Date of Patent: Jun. 18, 2002

(54) FABRICATION METHOD FOR A DUAL DAMASCENE STRUCTURE

(75) Inventors: Akira Mao, Tainan; Min-Hung Wang, Hsinchu, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/867,135

(22) Filed: May 29, 2001

(51) Int. Cl.[7] .......................................... H01L 21/4763

(52) U.S. Cl. ..................... 438/622; 438/619; 438/421; 438/637; 438/638

(58) Field of Search .................. 438/619, 622–624, 438/421, 422, 637–640

(56) References Cited

U.S. PATENT DOCUMENTS 6,214,719 B1 * 4/2001 Nag ............................ 438/421

* cited by examiner

Primary Examiner—Tuan H. Nguyen
Assistant Examiner—Thanh Nguyen

(57) ABSTRACT

A fabrication of a damascene structure is described. A substrate having a first conductive layer formed thereon is provided. A silicon nitride type of first dielectric layer is formed on the substrate, followed by patterning the first dielectric layer to form a trench like structure. A silicon oxide type of second dielectric layer is then formed on the first dielectric layer and in the trench like structure and an air-gap is concurrently formed in the second dielectric layer that is in the trench like structure. Thereafter, the second dielectric layer is planarized until a surface of the first dielectric layer is exposed. The first dielectric layer is then removed to form a trench, followed by filling the trench with a second conductive layer.

10 Claims, 5 Drawing Sheets

FABRICATION METHOD FOR A DUAL DAMASCENE STRUCTURE

BACKGROUND OF THE INVENTION

1. Field of Invention

This invention relates to a fabrication method for multi-level interconnects. More particularly, the present invention relates to a fabrication method for a damascene structure that comprises an air-gap type of dielectric layer.

2. Description of Related Art

The conventional fabrication method for interconnects includes depositing a metal layer on an insulation layer, for example, a silicon oxide layer, wherein the insulation layer is used to isolate the metal layer. The metal layer is then defined to a pre-determined pattern of a conductive line, followed by forming a vertical via opening between the layers of conductive line. A conductive layer of similar or different material from the metal layer further fills the via opening to complete the vertical connection between the layers of conductive line. A point that is worth noting is, as the number of layers of conductive line in an integrated circuit increases, the metal layer design with two layers and above gradually becomes the method to use in the fabrication of many integrated circuits. The metal layers are isolated by inter-metal dielectrics (IMD) and a via is used to connect the upper and the lower metal layers of conductive lines.

A majority of the conventional inter-metal dielectric layer is the plasma-enhanced chemical vapor deposited (PECVD) silicon oxide or the low dielectric constant dielectric layer. The dielectric constant for a silicon oxide dielectric layer is, however, too high and parasitic capacitance tends to generate between the metal interconnects. On the other hand, the dielectric layer with a low dielectric constant normally does not have sufficient mechanical strength, which poses a great challenge when chemical mechanical polishing is conducted. Moreover, the low dielectric constant dielectric layer does not have very stable thin film property. As a result, the problems of out-gassing and peeling often occur. Additionally, the low dielectric constant dielectric layer needs to be cleaned under oxygen-free plasma after etching to prevent the pattern from being damaged. The manufacturing process, thereby, becomes more complicated.

SUMMARY OF THE INVENTION

The invention provides a fabrication method for a damascene structure, wherein the inter-metal dielectric layer comprises a low dielectric constant and a high mechanical strength.

The present invention provides a fabrication method for an inter-metal dielectric layer, wherein silicon oxide is the major component for the inter-metal dielectric layer to improve the problems of the conventional low dielectric constant materials.

The present invention provides a fabrication method for a damascene structure, wherein a substrate already comprising a first conductive layer is provided. A silicon nitride type of a first dielectric layer is then formed on the substrate, followed by patterning the first dielectric layer to form a trench like structure. A silicon oxide type of a second dielectric layer is then formed on the first dielectric layer and in the trench like structure. The second dielectric layer is planarized until the surface of the first dielectric layer is exposed. The first dielectric layer is further removed to form a trench, followed by filling the trench with a second conductive layer.

According to the fabrication method for a dual damascene structure of the present invention, a substrate comprising a first conductive layer is provided. A silicon oxide type of a first dielectric layer and a silicon nitride type of a second dielectric layer are sequentially formed on the substrate. The second dielectric layer is then patterned to form a trench like structure. A silicon oxide type of third dielectric layer is then formed on the second dielectric layer and in the trench like structure, wherein an air-gap is concurrently formed in the third dielectric layer in the trench like structure. The third dielectric layer is then planarized until a surface of the second dielectric layer is exposed. The second dielectric layer is then removed to form a trench. The first dielectric layer is patterned to form a via opening to expose the first conductive layer, wherein the via opening and the trench together form a dual damascene opening. A second conductive layer subsequently fills the dual damascene opening.

According to the present invention, an air-gap is formed in the dielectric layer to lower the dielectric constant of the dielectric layer and to reduce the parasitic capacitance between the interconnects.

The present invention employs silicon oxide as a major component for the dielectric layer, wherein its mechanical strength and thin film property are better than other low dielectric constant materials.

According to the present invention, the depth of the trench is determined by the thickness of the deposited silicon nitride dielectric layer. A trench having a non-uniform depth resulted from inconsistent etching rates due to the various trench widths and trench density as in the conventional practice is thus prevented.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Preferred Embodiment 1

FIGS. 1A through 1E are schematic, cross-sectional views, illustrating successive steps in fabricating a damascene structure according to a preferred embodiment of the present invention.

Figure 1A:
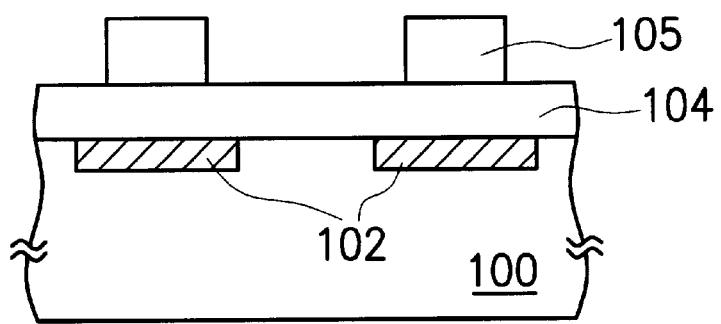
FIGS. 1A through 1F are schematic, cross-sectional views, illustrating successive steps in fabricating a damascene structure according to a preferred embodiment of the present invention.

As shown in FIG. 1A, a substrate 100 is provided, wherein a conductive layer 102 is formed on the substrate 100. The conductive layer 102 is, for example, copper. A dielectric layer 104 is then formed on the conductive layer 102, for example, by plasma enhanced chemical vapor deposition. The dielectric layer 104 is, for example, silicon nitride, and is formed with a thickness of about 300 angstroms to about 8000 angstroms. A photoresist layer 105 is further formed on the dielectric layer 104, covering at where the damascene structure is going to be formed. Using the photoresist layer 105 as a mask, a reverse trench pattern is formed.

Figure 1B:
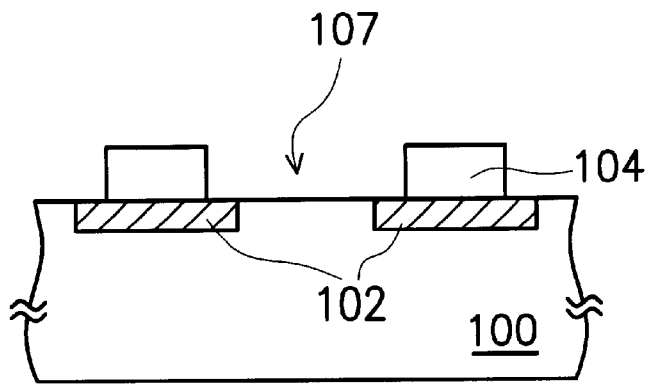

Referring to FIG. 1B, the dielectric layer 104 is patterned to form a trench like structure 107, exposing a part of the substrate 100.

Figure 1C:
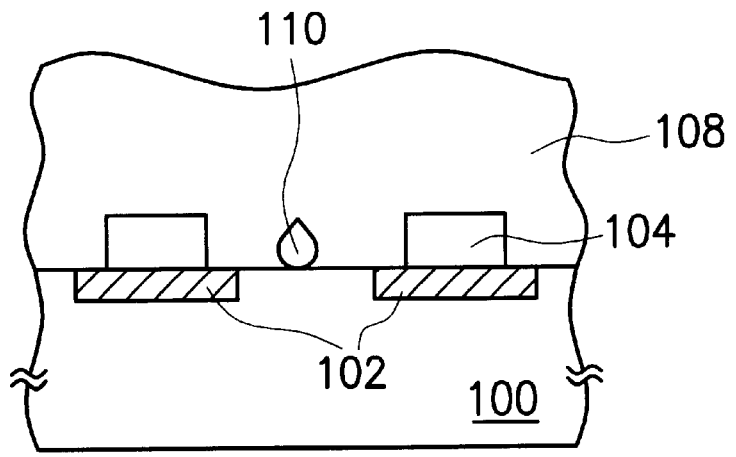

Thereafter, as shown in FIG. 1C, a dielectric layer 108 is formed on the dielectric layer 104 and in the trench like structure 107. An air-gap 110 is concurrently formed in the dielectric layer 108. The dielectric layer 108 is formed by, for example, plasma enhanced chemical vapor deposition (PECVD), atmospheric pressure chemical vapor deposition (APCVD) or high density plasma chemical vapor deposition (HDCVD). The dielectric layer 108 is, for example, a material that comprises fluorosilicate glass (FSG) or silicon oxide with a thickness of about 8000 angstroms to about 20000 angstroms.

According to the preferred embodiment of the present invention, the dielectric layer 108 comprising an air-gap 10 is served as the inter-metal dielectric layer.

Since air is present in the air-gap 110, the dielectric constant for the entire inter-metal dielectric layer is thereby lower to lower the parasitic capacitance of the metal interconnects. Moreover, silicon oxide is used as a major component for the inter-metal dielectric layer. The inter-metal dielectric layer of the present invention thereby possess a better mechanical strength and thin film property than other low dielectric constant materials commonly used in the prior art.

Figure 1D:
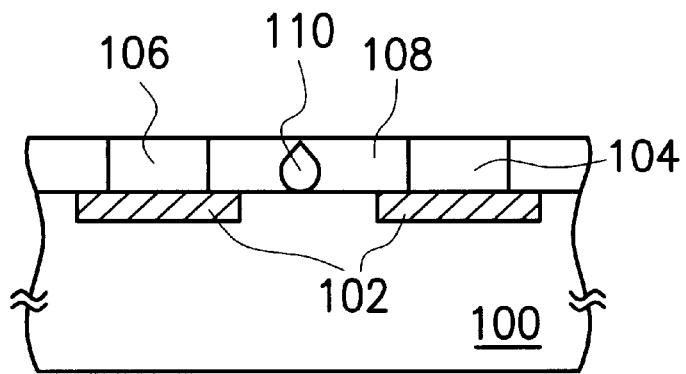

Referring to FIG. 1D, a planarization process is conducted on the dielectric layer 108 until a surface of the dielectric layer 104 is exposed. The planarization process, such as, chemical mechanical polishing, is conducted to remove the excess dielectric layer 108 until the surface of the dielectric layer 104 is exposed. In another words, the dielectric layer 104 serves as a polishing end point in the planarization process.

Figure 1E:
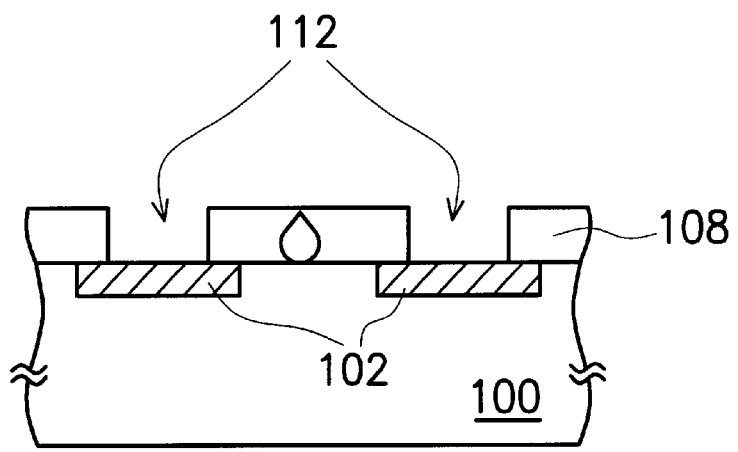

Referring to FIG. 1E, the dielectric layer 104 is removed to form a trench 112, exposing a part of the first conductive layer 102, wherein the dielectric layer 104 is removed, for example, by hot phosphoric acid.

According to the present invention, the thickness of the dielectric layer 104 serves as the depth of the trench 112. As a result, a trench having a non-uniform depth resulted from inconsistent etching rates due to various trench widths and trench density is thus prevented.

Figure 1F:
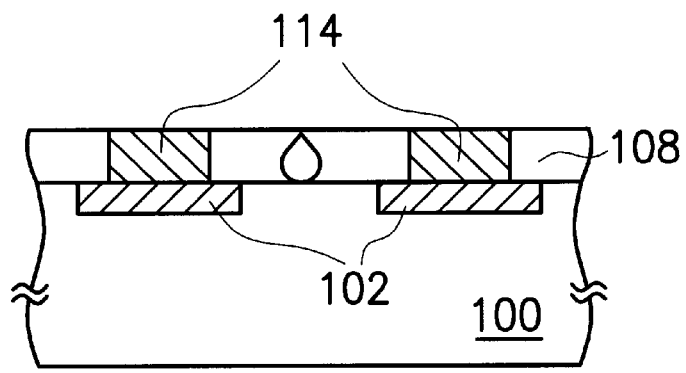

Continuing to FIG. 1F, a conductive layer fills the trench 112 to form a damascene structure 114, wherein the conductive layer is, for example, copper. Filling the trench 112 with the conductive layer to form the damascene structure 114 is, for example, by sequentially forming a barrier layer and a seed layer on the surface of the trench 112. A conductive layer is then formed, filling the via opening, followed by mechanical polishing the excess conductive layer until the surface of the dielectric layer 108 is exposed.

Preferred Embodiment 2

FIGS. 2A through 2H are schematic, cross-sectional views, illustrating successive steps in fabricating a dual damascene structure according to another preferred embodiment of the present invention.

Figure 2A:
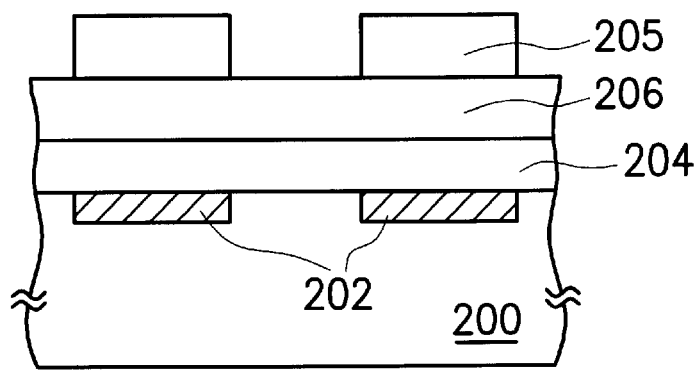
FIGS. 2A through 2H are schematic, cross-sectional views, illustrating successive steps in fabricating a dual damascene structure according to another preferred embodiment of the present invention.

Referring to FIG. 2A, a substrate 200 is provided, wherein a conductive layer 202 is formed on the substrate 200. The conductive layer 202 is, for example, copper. A dielectric layer 204 is then formed on the conductive layer 202, for example, by plasma enhanced chemical vapor deposition. The dielectric layer 104 is, for example, silicon oxide, and is about 100 angstroms to about 5000 angstroms thick. A dielectric layer 206 is then formed on the dielectric layer 204, wherein the dielectric layer 206 is formed by, for example, plasma enhanced chemical vapor deposition. The dielectric layer 206 is, for example, silicon nitride, and is about 300 angstroms to about 8000 angstroms thick. Furthermore, the dielectric layer 206 and the dielectric layer 204 comprise a high etching selectivity ratio. A photoresist layer 205 is formed on the dielectric layer 206, covering at where the dual damascene structure is going to be formed. Using the photoresist layer 205 as a mask, a reverse trench pattern is formed.

Figure 2B:
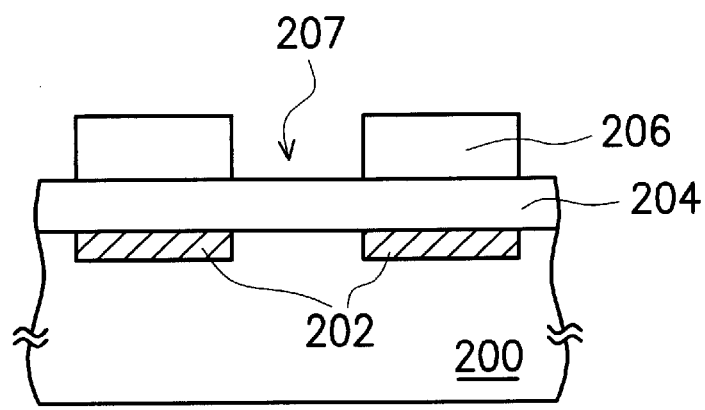

Referring to FIG. 2B, the dielectric layer 206 is then patterned to form a trench like structure 207, exposing the dielectric layer 204. Since the dielectric layer 206 and the dielectric layer 204 comprises a high etching selectivity ratio, the dielectric layer 204 serves as an etching stop layer when a portion of the dielectric layer 206 is removed to form the trench like structure 207.

Figure 2C:
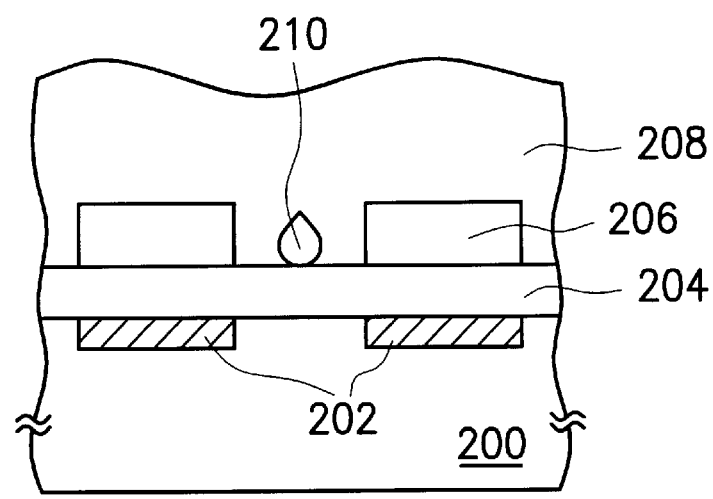

Continuing to FIG. 2C, a dielectric layer 208 is formed on the dielectric layer 206 and in the trench like structure 207, wherein an air-gap 210 is concurrently formed in the dielectric layer 208 in the trench like structure 207. The dielectric layer 208 is formed by, for example, plasma enhanced chemical vapor deposition, atmospheric chemical vapor deposition or high density plasma chemical vapor deposition. The dielectric layer 208, is, for example, a material that comprises fluorosilicate glass or silicon oxide, and is about 8000 angstroms to about 20000 angstroms thick.

According to the present invention, the dielectric layer 204 and the dielectric layer 208 that comprises an air-gap 210 function as the inter-metal dielectric layer. Since air is present in the air-gap 210, the entire inter-metal dielectric layer thus has a low dielectric constant to lower the parasitic capacitance between the metal interconnects. Moreover, a major component of the inter-metal dielectric layer is silicon oxide. The inter-metal dielectric layer of the present invention thus has a better mechanical strength and thin film property than the conventional low dielectric constant materials.

Figure 2D:
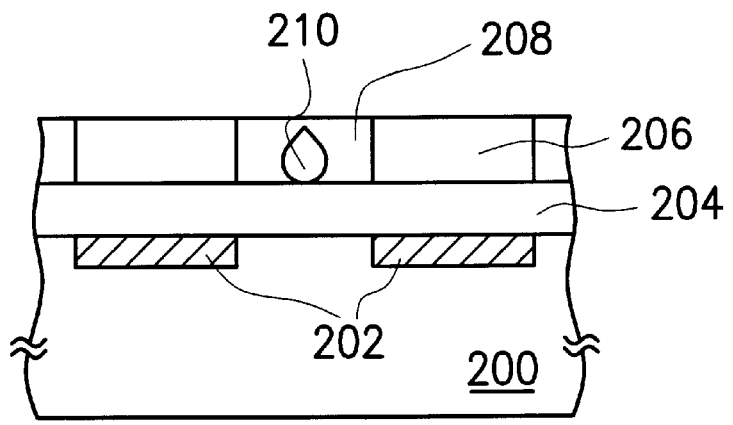

Thereafter, as shown in FIG. 2D, the dielectric layer 208 is planarized until a surface of the dielectric layer 206 is exposed. The dielectric layer 208 is planarized by, for example, chemical mechanical polishing until the excess dielectric layer 208 is remove and the surface of the dielectric layer 206 is exposed. In another words, the dielectric layer 206 serves as an polishing endpoint in the planarization process.

Figure 2E:
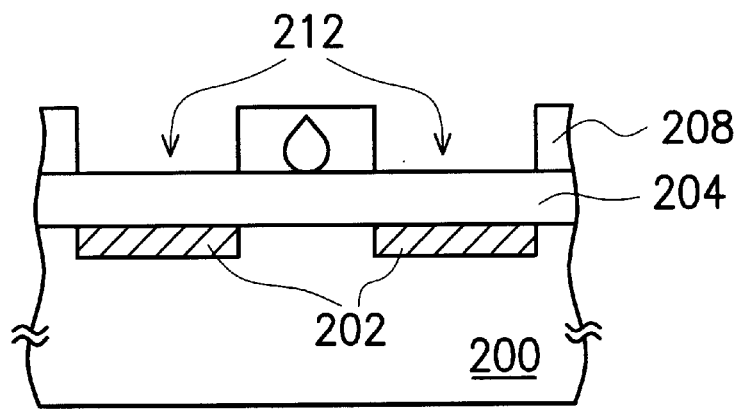

Referring to FIG. 2E, the dielectric layer 206 is removed to form a trench 212, exposing a portion of the dielectric layer 204. The dielectric layer 206 is removed by, for example, hot phosphoric acid.

According to the present invention, the thickness of the dielectric layer 206 serves as the depth of the trench. A trench having a non-uniform depth resulted from inconsistent etching rates due to various trench widths and trench density is thus prevented.

Figure 2F:
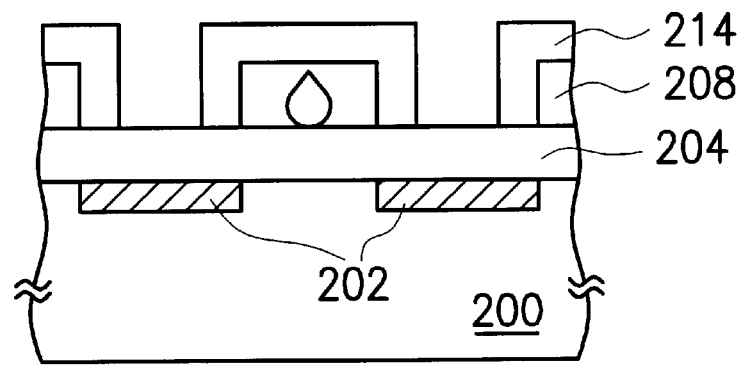

Continuing to FIG. 2F, a photoresist layer 214 is formed on the dielectric layer 208, exposing the dielectric layer 204 where a dual damascene structure is going to be formed.

Figure 2G:
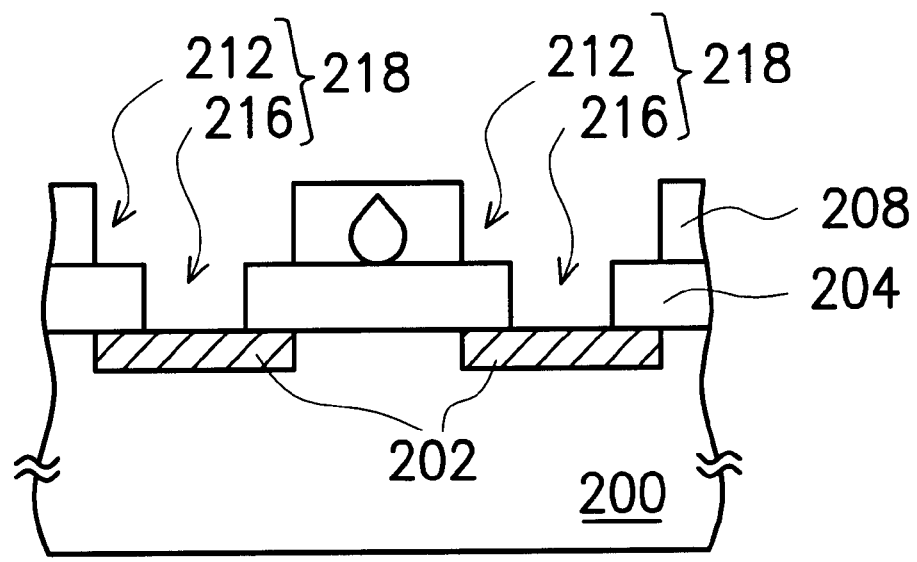

Thereafter, as shown in FIG. 2G, the dielectric layer 204 is patterned to form a via opening 216, exposing the conductive layer 202. The via opening 216 and the trench 212 together form a dual damascene opening 218.

Figure 2H:
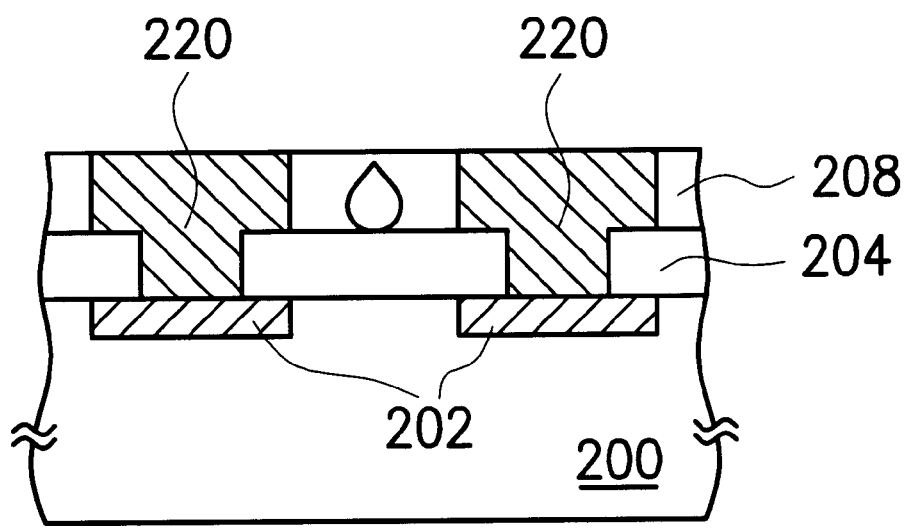

Referring to FIG. 2H, a conductive layer fills the dual damascene opening 218 to form the dual damascene structure 220, wherein the conductive layer is, for example, copper. Filling the dual damascene opening 218 with the conductive layer includes forming sequentially a barrier layer and a seed layer on the surface of the dual damascene opening 218. A conductive layer is then deposited to fill the damascene opening, followed by chemical mechanical polishing the excess conductive layer until the dielectric layer 208 is exposed.

According to the present invention, an air-gap is formed in the dielectric layer. The dielectric constant of the dielectric layer is thus lower to lower the parasitic capacitance between the interconnects.

According to the present invention, the major component of the inter-metal dielectric layer is silicon oxide. The inter-metal dielectric layer of the present invention thus has better mechanical strength and thin film property than the conventional low dielectric constant materials.

According to the present invention, the thickness of the dielectric layer 104 serves as the depth of the trench. A trench having a non-uniform depth resulted from inconsistent etching rates due to various trench widths and trench density is thus prevented.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a dual damascene structure, comprising:

providing a substrate that already comprises a first conductive layer formed thereon;

forming a first dielectric layer on the substrate;

forming a second dielectric layer on the first dielectric layer;

patterning the second dielectric layer to form a trench like structure;

forming a third dielectric layer on the second dielectric layer and in the trench like structure and concurrently forming an air-gap in the third dielectric layer in the trench like structure;

planarizing the third dielectric layer until a surface of the second dielectric layer is exposed;

removing the exposed second dielectric layer to form a trench;

patterning the first dielectric layer to form a via opening, exposing the first conductive layer, wherein the via opening and the trench form a dual damascene opening; and filling the dual damascene opening with a second conductive layer.

2. The method of claim 1, the third dielectric layer is formed by plasma enhanced chemical vapor deposition, atmospheric chemical vapor deposition or high density plasma chemical vapor deposition.

3. The method of claim 1, wherein the third dielectric layer is about 8000 angstroms to about 20000 angstroms thick.

4. The method of claim 1, wherein the third dielectric layer is a material that comprises fluorosilicate glass or silicon oxide.

5. The method of claim 1, wherein the first dielectric layer and the second dielectric layer have a high etching selectivity ratio.

6. The method of claim 1, wherein the first dielectric layer includes silicon oxide.

7. The method of claim 1, wherein the second dielectric layer includes silicon nitride.

8. The method of claim 1, wherein removing the second dielectric layer includes using hot phosphoric acid.

9. The method of claim 1, wherein the first dielectric layer is about 100 angstroms to about 5000 angstroms thick.

10. The method of claim 1, wherein the second dielectric layer is about 3000 angstroms to about 8000 angstroms thick.

\* \* \* \* \*